(12) United States Patent
Jang et al.

(10) Patent No.: US 11,011,598 B2
(45) Date of Patent: May 18, 2021

(54) SPLICED UNIT AND SPLICED PANEL

(71) Applicant: Au Optronics Corporation, Hsinchu (TW)

(72) Inventors: Je-Ruei Jang, Hsinchu (TW); Min-Yao Lu, Hsinchu (TW); Chun-Han Tai, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 47 days.

(21) Appl. No.: 16/455,776

(22) Filed: Jun. 28, 2019

(65) Prior Publication Data

US 2020/0168697 A1 May 28, 2020

(30) Foreign Application Priority Data

Nov. 23, 2018 (TW) .................................. 107141830

(51) Int. Cl.
*H01L 29/18* (2006.01)
*H01L 27/32* (2006.01)
*H01L 27/15* (2006.01)
*H01L 51/52* (2006.01)

(52) U.S. Cl.
CPC ........ *H01L 27/3293* (2013.01); *H01L 27/156* (2013.01); *H01L 51/5253* (2013.01); *H01L 2227/326* (2013.01)

(58) Field of Classification Search
CPC ............. H01L 27/3253; H01L 27/3276; H01L 27/3293; H01L 51/5253; H01L 227/326
See application file for complete search history.

(56) References Cited

U.S. PATENT DOCUMENTS

| | | | |
|---|---|---|---|
| 9,437,782 B2 | 9/2016 | Bower et al. | |
| 9,478,583 B2 | 10/2016 | Hu et al. | |
| 9,741,785 B2 | 8/2017 | Bower et al. | |
| 2015/0137098 A1* | 5/2015 | Tanaka | H01L 51/5246 257/40 |
| 2016/0266061 A1* | 9/2016 | Yu | B81C 1/00269 |
| 2018/0182840 A1 | 6/2018 | Lin | |
| 2018/0206336 A1* | 7/2018 | Fedder | H05K 1/185 |

FOREIGN PATENT DOCUMENTS

| | | |
|---|---|---|
| CN | 106783920 | 5/2017 |
| TW | I662334 | 6/2019 |

* cited by examiner

*Primary Examiner* — Phuc T Dang
(74) *Attorney, Agent, or Firm* — JCIPRNET

(57) ABSTRACT

A spliced unit including a substrate, a circuit unit, and light-emitting units is provided. The substrate includes a first part having a first bottom surface and a first top surface opposite to the first bottom surface, and a second part having a second bottom surface and a second top surface opposite to the second bottom surface. There is a height difference between the first bottom surface of the first part and the second bottom surface of the second part. The circuit unit is disposed on the first top surface. The light-emitting units are disposed in the second part of the substrate. In a direction of a normal line perpendicular to the substrate, the first part of the substrate and the second part of the substrate are not overlapped, and the circuit unit and the light-emitting units are not overlapped. A spliced panel including the spliced units is also provided.

10 Claims, 9 Drawing Sheets

SPLICED UNIT AND SPLICED PANEL

CROSS-REFERENCE TO RELATED APPLICATION

This application claims the priority benefit of Taiwan application serial no. 107141830, filed on Nov. 23, 2018. The entirety of the above-mentioned patent application is hereby incorporated by reference herein and made a part of this specification.

BACKGROUND

Technical Field

The disclosure relates to a spliced unit and a spliced panel; more particularly, the disclosure relates to a spliced unit having a height difference and a spliced panel including the spliced units.

Description of Related Art

To comply with the needs of users to display a variety of shared information and comprehensive information on a large scale, a spliced display apparatus with a plurality of integrated display panels has been widely used in various fields. For instance, the spliced display apparatus is commonly seen in public information display fields (e.g., large advertisements, surveillance management screens, etc.) or private information display fields (e.g., mobile phones, etc.).

Generally, a light-emitting diode (LED) display panel includes a plurality of LEDs (e.g., micro-LEDs) and a driver circuit driving the LEDs. However, as the demand for resolution increases, the number of LEDs also increases, thus causing the driver circuit to occupy a larger area of the display panel. Therefore, the density of the LEDs cannot be further increased, and thus the resolution cannot be further improved.

SUMMARY

The disclosure provides a spliced unit and a spliced panel capable of improving resolution and display quality.

In an embodiment of the disclosure, a spliced unit includes a substrate, a circuit unit, and a plurality of light-emitting units. The substrate includes a first part having a first bottom surface and a first top surface opposite to the first bottom surface and a second part having a second bottom surface and a second top surface opposite to the second bottom surface. There is a height difference between the first bottom surface of the first part and the second bottom surface of the second part. The circuit unit is disposed at the first top surface. The light-emitting units are disposed at the second part of the substrate. In a direction of a normal line perpendicular to the substrate, the first part of the substrate and the second part of the substrate are not overlapped, and the circuit unit and the light-emitting units are not overlapped.

In an embodiment of the disclosure, a spliced panel includes a plurality of spliced units and a driver circuit board. Each of the spliced units includes a substrate. The substrate includes a first part having a first bottom surface and a second part having a second bottom surface. There is a height difference between the first bottom surface of the first part and the second bottom surface of the second part. The spliced units are disposed on the driver circuit board, and the first part is located between the second part and the driver circuit board. The spliced unit includes at least one first spliced unit and at least one second spliced unit. An accommodation space exists between the second part of the at least one first spliced unit and the driver circuit board, and the first part of the at least one second spliced unit is located in the accommodation space.

In view of the above, in the spliced unit and the spliced panel provided in one or more embodiments of the disclosure, the cross-section of the spliced unit has a step-like shape; hence, the circuit unit and the light-emitting units can be disposed at different horizontal planes, and the circuit unit and the light-emitting units on the same spliced unit are not overlapped. Therefore, during the splicing operation, the light-emitting units of adjacent first spliced units in the spliced panel and the circuit unit of the second spliced unit can be overlapped. As such, the circuit unit not capable of performing a display function can be located in the accommodation space between the second part and the driver circuit board without occupying any display space. With said configurations, the second part of the first spliced unit can adjoin the second part of the second spliced unit. Thereby, the overall density of the light-emitting units on the spliced panel can be increased, so as to further improve the resolution and the display quality of the spliced panel.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
FIG. 1A to FIG. 1J are schematic cross-sectional views illustrating a manufacturing process of a spliced unit according to an embodiment of the disclosure.

In the accompanying drawings, thicknesses of layers, films, panels, regions and so on are exaggerated for clarity. Throughout the specification, the same reference numerals in the accompanying drawings denote the same elements. It should be understood that when an element such as a layer, film, region or substrate is referred to as being "on" or "connected to" another element, it can be directly on or connected to the other element, or intervening elements may also be present. In contrast, when an element is referred to as being "directly on" or "directly connected to" another element, there is no intervening element present. As used herein, the term "connected" may refer to physically connected and/or electrically connected. Besides, "electrical connection" or "coupling" may be referred to as an intervening element existing between two elements.

It should be known that the terms "first," "second," "third," and the like are applied in the disclosure to describe each of the elements, parts, regions, layers and/or portions, but such terms should not limit the elements, parts, regions, layers and/or portions. These terms are only used to distinguish one element, part, region, layer, or portion from another. Hence, "the first element," "the first part," "the first region," "the first layer," or "the first portion" may also be called as "the second element," "the second part," "the second region," "the second layer," or "the second portion" without departing from the teachings provided herein.

Unless otherwise defined, all terms (including technical and scientific terms) used herein have the same meaning as commonly understood by persons of ordinary skill in the art. It will be further understood that terms, such as those defined in commonly used dictionaries, should be interpreted as having a meaning that is consistent with their meaning in the context of the relevant art and the disclosure and will not be interpreted in an idealized or overly formal sense unless expressly so defined herein.

Figure 1B:
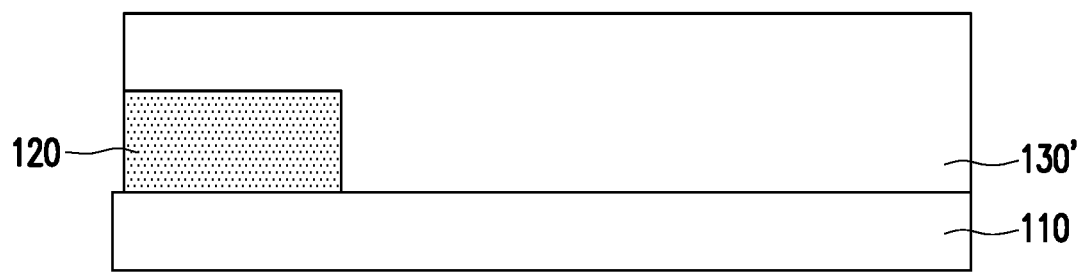
Figure 1C:
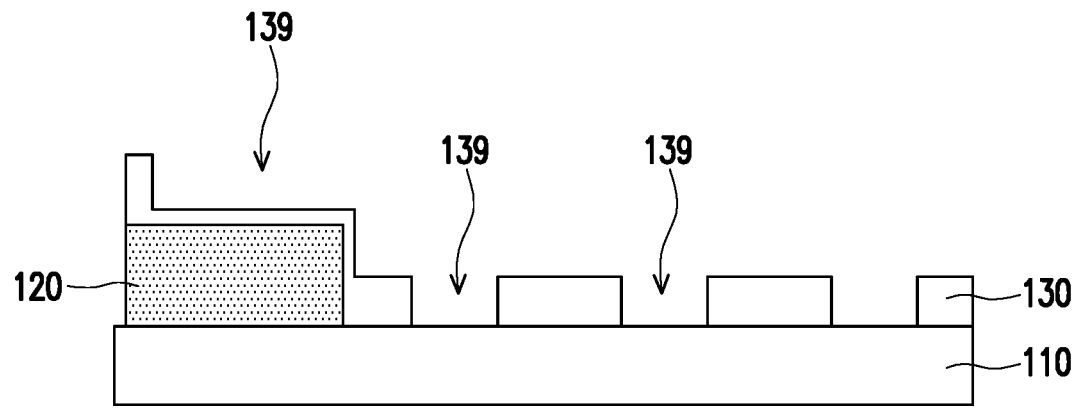
Figure 1D:
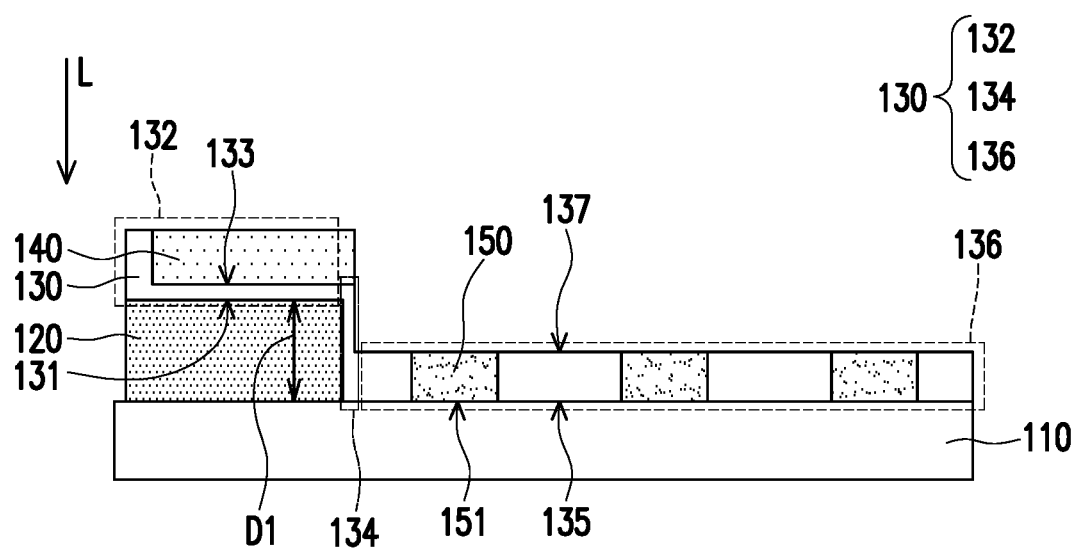
Figure 1E:
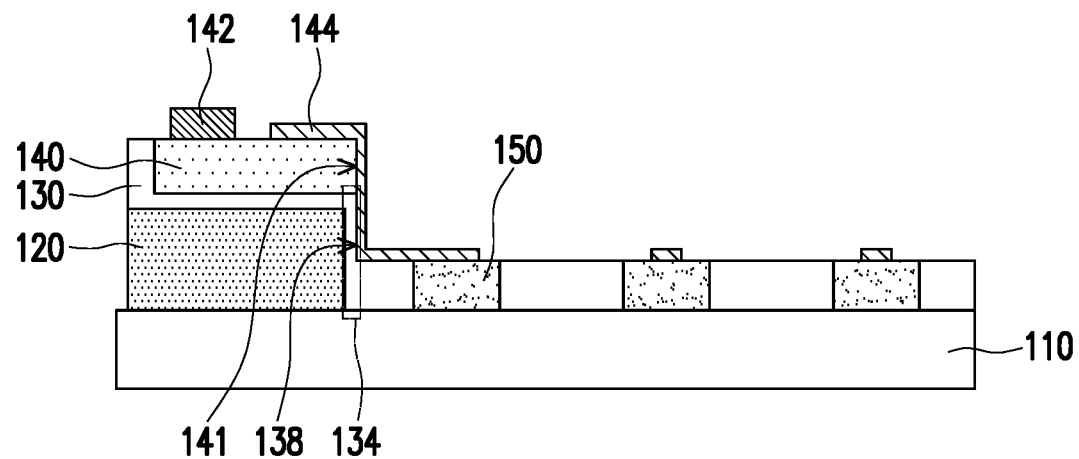
Figure 1F:
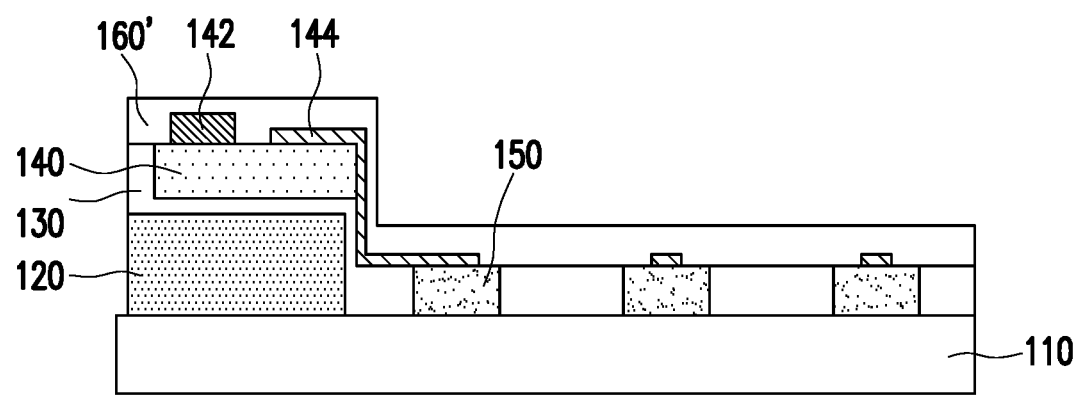
Figure 1G:
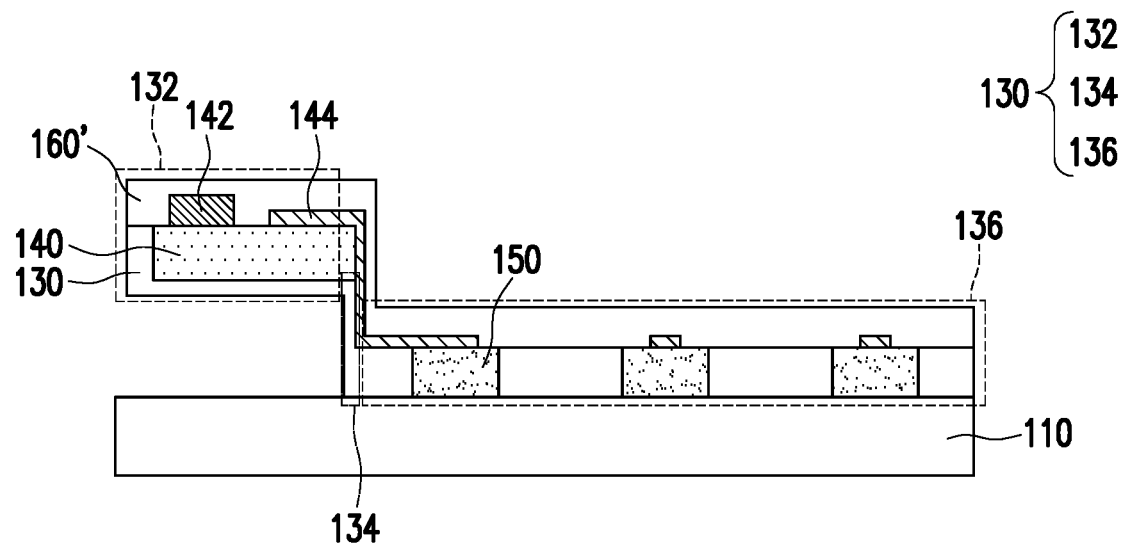
Figure 1H:
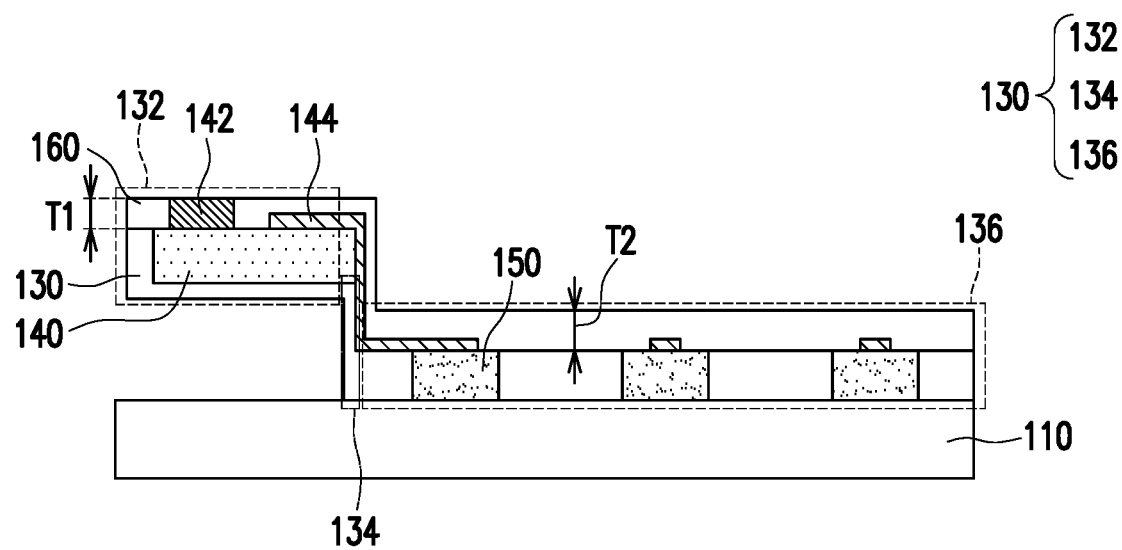
Figure 1I:
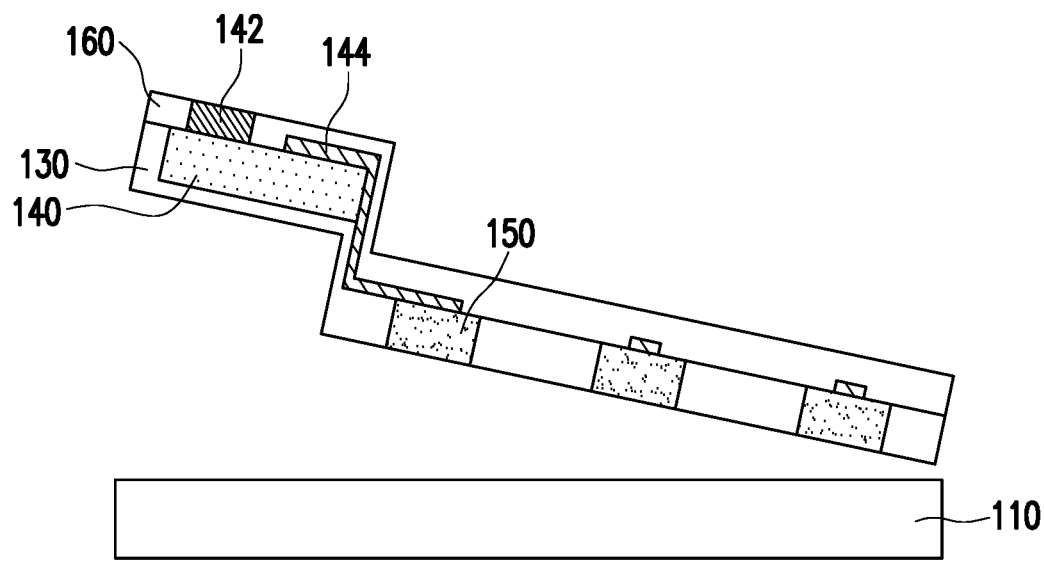
Figure 1J:
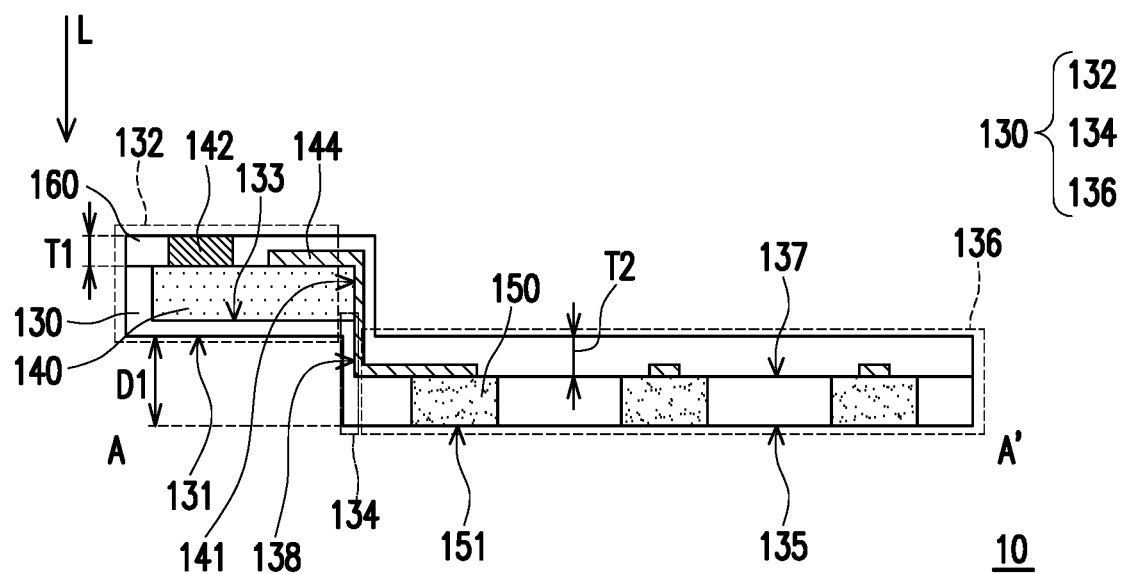
Figure 2:
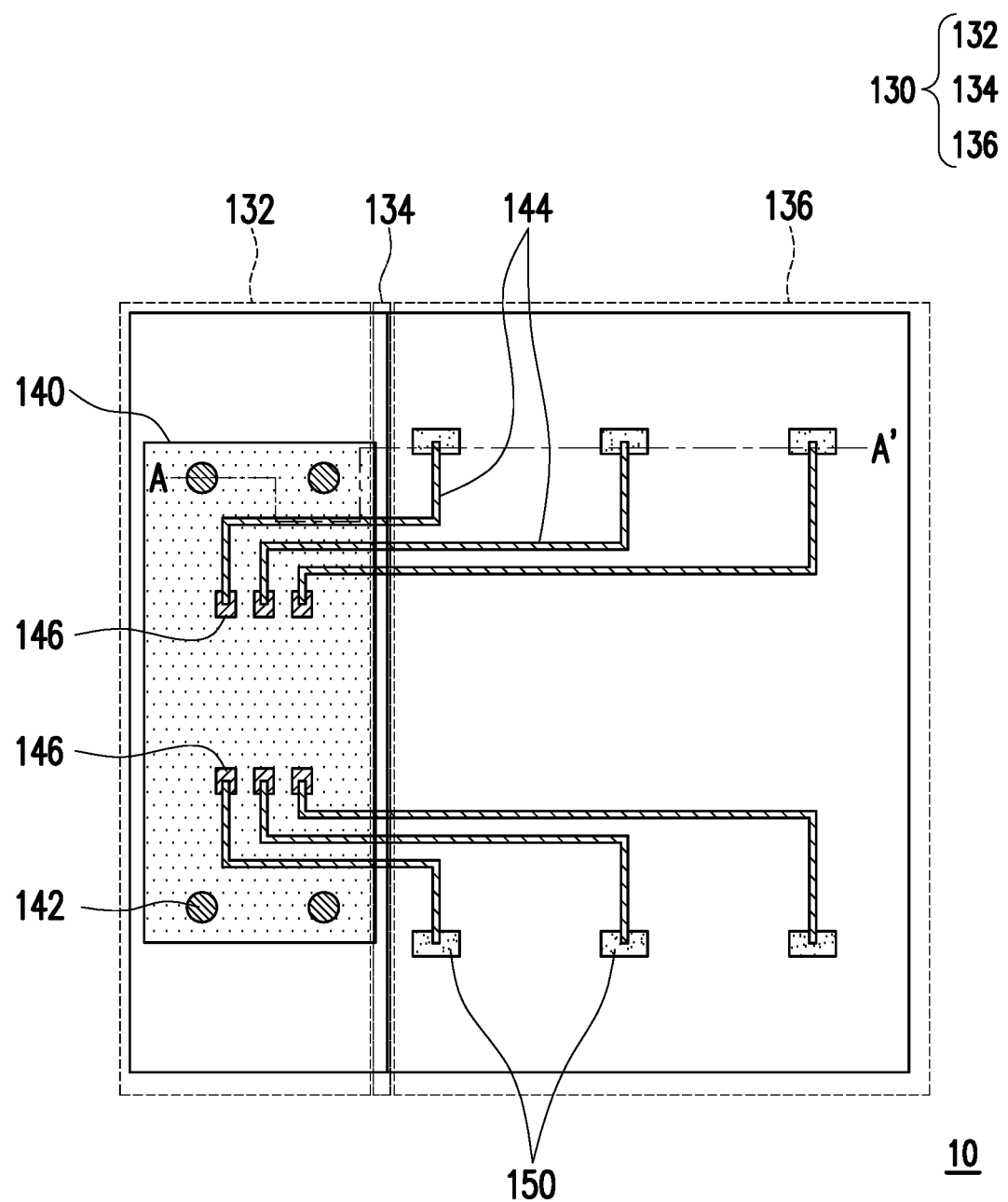
FIG. 2 is a schematic top view of a spliced unit according to an embodiment of the disclosure.

FIG. 1A to FIG. 1J are schematic cross-sectional views illustrating a manufacturing process of a spliced unit according to an embodiment of the disclosure. FIG. 2 is a schematic top view of a spliced unit according to an embodiment of the disclosure. For better explanation and observation, FIG. 2 schematically illustrates some of the components while omitting other components. With reference to FIG. 1J and FIG. 2, in the present embodiment, a spliced unit 10 includes a substrate 130, a circuit unit 140, and a plurality of light-emitting units 150. The substrate 130 includes a first part 132 having a first bottom surface 131 and a first top surface 133 opposite to the first bottom surface 131, and a second part 136 having a second bottom surface 135 and a second top surface 137 opposite to the second bottom surface 135. The circuit unit 140 is disposed at the first top surface 133. The light-emitting units 150 are disposed at the second part 136 of the substrate 130. A manufacturing process of the spliced unit 10 is briefly described below.

With reference to FIG. 1A, a temporary carrier 110 is provided. A patterned sacrificial layer 120 is formed on the temporary carrier 110. In the present embodiment, the material of the temporary carrier 110 may be glass, quartz, an organic polymer, a non-transparent and/or reflective material (e.g., wafer, ceramics, or any other suitable material), or any other suitable material. The material of the sacrificial layer 120 may also be an inorganic material, e.g., polysilicon, silicon oxide, or any other suitable material. In some embodiments, the sacrificial layer 120 is patterned by dry etching or wet etching, for instance. In a case of the wet etching, for instance, potassium hydroxide (KOH) or sodium hydroxide (NaOH) is selected as an etchant to pattern the sacrificial layer 120, which should however not be construed as a limitation in the disclosure.

Next, with reference to FIG. 1B, a photoresist material layer 130' is disposed on the temporary carrier 110 and covers the sacrificial layer 120. In the present embodiment, the material of the photoresist material layer 130' includes a polymer material or an acrylic material, which should not be construed as a limitation in the disclosure.

With reference to FIG. 1B and FIG. 1C, the photoresist material layer 130' is patterned to form the substrate 130 having reserved space 139. In the present embodiment, a method of forming the substrate 130 includes a photolithography and etching process, which should however not be construed as a limitation in the disclosure. For instance, a mask (not shown) having a preset pattern may be applied to perform etching, half-etching, or partially etching the photoresist material layer 130', so as to form the reserved space 139 in the substrate 130. The mask having the preset pattern includes a patterned photoresist pattern, a gray-tone mask, or a half-tone mask (HTM), which should however not be construed as a limitation in the disclosure.

With reference to FIG. 1C and FIG. 1D, the corresponding circuit unit 140 and the light-emitting units 150 are respectively disposed in the reserved space 139. For instance, in a direction of a normal line L perpendicular to the substrate 130, the patterned substrate 130 includes a first part 132 overlapping the sacrificial layer 120, a second part 136 disposed on the temporary carrier 110 and not overlapped with the sacrificial layer 120, and a connection part 134 connecting the first part 132 to the second part 136. From another point of view, in a direction parallel to a long axis of the temporary carrier 110, the connection part 134 is located between the first part 132 and the second part 136.

The first part 132 of the substrate 130 has a first bottom surface 131 and a first top surface 133 opposite to the first bottom surface 131. The second part 136 of the substrate 130 has a second bottom surface 135 and a second top surface 137 opposite to the second bottom surface 135. The circuit unit 140 is disposed in the reserved space 139 of the first part 132 and on the first top surface 133. The circuit unit 140 is, for instance, an integrated circuit (IC) or a chip driving the light-emitting units 150. The light-emitting units 150 are disposed in the reserved space 139 in the second part 136 of the substrate 130. In the present embodiment, the light-emitting units 150 are, for instance, LEDs including micro-LEDs, mini-LEDs, and quantum dot LEDs. A method of disposing the light-emitting units 150 includes: forming the light-emitting units 150 first on a transfer carrier and performing a pick-and-place process to dispose the light-emitting units 150 in the second part 136. In some embodiments, the light-emitting units 150 can be disposed in the second part 136 in a face up manner. That is, electrodes (not shown) of the light-emitting units 150 are close to the second top surface 137, and light-exiting surfaces 151 of the light-emitting units 150 are close to the second bottom surface 135 or substantially coplanar with the second bottom surface 135; the disclosure is not limited thereto.

It is worth noting that, in the direction of the normal line L perpendicular to the substrate 130, there is a height difference D1 between the first bottom surface 131 of the first part 132 and the second bottom surface 135 of the second part 136 of the substrate 130. For instance, the height difference D1 is 8 μm to 11 μm. In addition, the first part 132 of the substrate 130 and the second part 136 of the substrate 130 are not overlapped, and the circuit unit 140 and the light-emitting units 150 are not overlapped. With said configurations, the cross-section of the substrate 130 has a step-like shape. The circuit unit 140 and the light-emitting units 150 may be respectively disposed on the first part 132 and the second part 136 on different horizontal planes.

With reference to FIG. 1E and FIG. 2, a plurality of signal lines 144 are disposed on the substrate 130. In consideration of conductivity, the signal lines 144 are often made of metal materials, which should however not be construed as a limitation in the disclosure. In other embodiments, the signal lines 144 may also be made of other conductive materials, such as alloy, metal nitride, metal oxide, metal oxynitride, or a stacked layer of the metal material and other conductive materials. A method of forming the signal lines 144 includes physical vapor deposition (PVD), chemical vapor deposition (CVD), electroplating, or any other appropriate method, which should however not be construed as a limitation in the disclosure.

The signal lines 144 respectively extend from the circuit unit 140 to the light-emitting units 150 along a sidewall 138 of the connection part 134. Particularly, the circuit unit 140 includes a plurality of internal bonding pads 146 (shown in FIG. 2) and a plurality of external bonding pads 142. The external bonding pads 142 and the internal bonding pads 146 may be formed on corresponding leads or bumps (not shown) on the circuit unit 140 while the signal lines 144 are being formed, so as to be electrically connected to the circuit unit 140. Through the connection of the signal lines 144 to the internal bonding pads 146 and the light-emitting units 150, the circuit unit 140 can be electrically connected to the light-emitting units 150. As such, the driving signal of the circuit unit 140 can be transmitted to the light-emitting units 150. The external bonding pads 142 and the signal lines 144 are electrically isolated, so as to allow the external bonding pads 142 to be electrically connected to external electronic devices (e.g., a printed circuit board (PCB) or a chip-on film (COF)) in subsequent steps.

It is worth noting that, when the reserved space 139 (shown in FIG. 1C) is formed in advance, a sidewall 141 of the circuit unit 140 and the sidewall 138 of the connection part 134 may be aligned. Thereby, a portion of the signal line 144, which is on the sidewall 141 of the circuit unit 140 and the sidewall 138 of the connection part 134, may extend on an aligned flat surface of the aligned walls without encountering an issue of difference in heights. As such, the probability of breaking the signal lines 144 can be reduced, and the overall electrical reliability can be improved. In other embodiments, the sidewall of the connection part can extend upwards to a plane of the upper surface of the circuit unit. That is, the circuit device is embedded in the substrate, and the sidewall of the substrate is parallel to the sidewall of the circuit device. As such, the signal lines extend from the upper surface of the circuit device to the sidewall of the connection part and connect the light-emitting units.

With reference to FIG. 1F, a protection material layer 160' is disposed on the substrate 130. Specifically, the protection material layer 160' is disposed on the entire substrate 130 and covers the circuit unit 140, the external bonding pads 142, the signal lines 144, and the light-emitting units 150. In the present embodiment, the material of the protection material layer 160' is, for instance, a photoresist material including a polymer material or an acrylic material, which should however not be construed as a limitation in the disclosure.

With reference to FIG. 1F and FIG. 1G, the sacrificial layer 120 is removed. A method of removing the sacrificial layer 120 includes: using an etchant (not shown) to remove the sacrificial layer 120. The etchant may be selected from KOH, NaOH, or any other appropriate alkaline or acidic etchant, which should however not be construed as a limitation in the disclosure.

With reference to FIG. 1G and FIG. 1H, an etching process and a planarizing process (not shown) are performed on the protection material layer 160' to form a protection layer 160 and expose the external bonding pads 142. For instance, a photolithography and etching process or a chemical-mechanical planarization (CMP) process can be performed to etch and remove the protection material layer 160' on the first part 132, so as to dispose the protection layer 160 on the first part 132 of the substrate 130, the connection part 134, and the second part 136. The protection layer 160 covers a portion of the circuit unit 140 and the light-emitting units 150.

It is worth noting that the protection layer 160 has a first thickness T1 on the first part 132 and has a second thickness T2 on the second part 136, and T2 is greater than T1. With said configurations, the thickness of the protection layer 160 on the first part 132 can be reduced until the protection layer 160 does not cover the external bonding pads 142, such that the external bonding pads 142 can be electrically connected to external electronic devices. The thickness of the protection layer 160 on the second part 136 is not reduced and remains sufficient, so as to cover and protect the signal lines 144 and the light-emitting units 150. Besides, the protection layer 160 can further serve to support the second part 136 and the light-emitting units 150 located at the second part 136. Thereby, the protection layer 160 is able to improve the overall structural strength and reliability of the spliced unit 10.

With reference to FIG. 1I and FIG. 1J, the substrate 130 and the light-emitting units 150 are separated from the temporary carrier 110, so as to complete the manufacturing process of the spliced unit 10. In the present embodiment, a method of separating the spliced unit 10 includes a laser lift-off process or mechanical removal, which should however not be construed as a limitation in the disclosure.

Please refer to FIG. 1J and FIG. 2. FIG. 1J is a schematic cross-sectional view of a spliced unit taken along a sectional line A-A' depicted in FIG. 2. Structurally speaking, the spliced unit 10 includes the substrate 130, the circuit unit 140, and the light-emitting units 150. The substrate includes a first part 132 and a second part 136. The circuit unit 140 is disposed at the first top surface 133 of the first part 132. The light-emitting units 150 are disposed at the second part 136. The height difference D1 exists between the first bottom surface 131 and the second bottom surface 135, and in the direction of the normal line L perpendicular to the substrate 130, the first part 132 of the substrate 130 are not overlapped with the second part 136 of the substrate 130. The circuit unit 140 and the light-emitting units 150 are not overlapped. Besides, the connection part 134 connects the first part 132 to the second part 136. The circuit unit 140 includes internal bonding pads 146 and external bonding pads 142. The signal lines 144 electrically connect the internal bonding pads 146 to the light-emitting units 150.

In brief, with said configurations, the cross-section of the spliced unit 10 has a step-like shape. The circuit unit 140 and the light-emitting units 150 may be respectively disposed on the first part 132 and the second part 136 on different horizontal planes and are not overlapped. Hence, during a subsequent splicing process, the circuit unit 140 of one of two adjacent spliced units 10 can be overlapped with the light-emitting units 150 of the other one of the two spliced units 10. Thereby, on the same horizontal plane, no circuit unit 140 is sandwiched between the light-emitting units 150 of different spliced units 10. As such, the distance between the light-emitting units 150 of the adjacent spliced units 10 can be reduced, and so can the display area occupied by the circuit unit 140 be reduced.

In addition, the sidewall 141 of the circuit unit 140 is aligned with the sidewall 138 of the connection part 134. Accordingly, the issue of difference in heights can be prevented, the probability of breaking the signal lines 144 can be reduced, and the overall electrical reliability can be improved. In addition, the protection layer 160 not only can serve to protect the light-emitting units 150 but also can serve to support the second part 136. The protection layer 160 can therefore improve the overall structural strength and reliability of the spliced unit 10.

The reference numerals and a part of the contents in the previous embodiment are used in the following embodiments, in which identical reference numerals indicate identical or similar devices, and repeated description of the same technical contents is omitted.

Figure 3A:
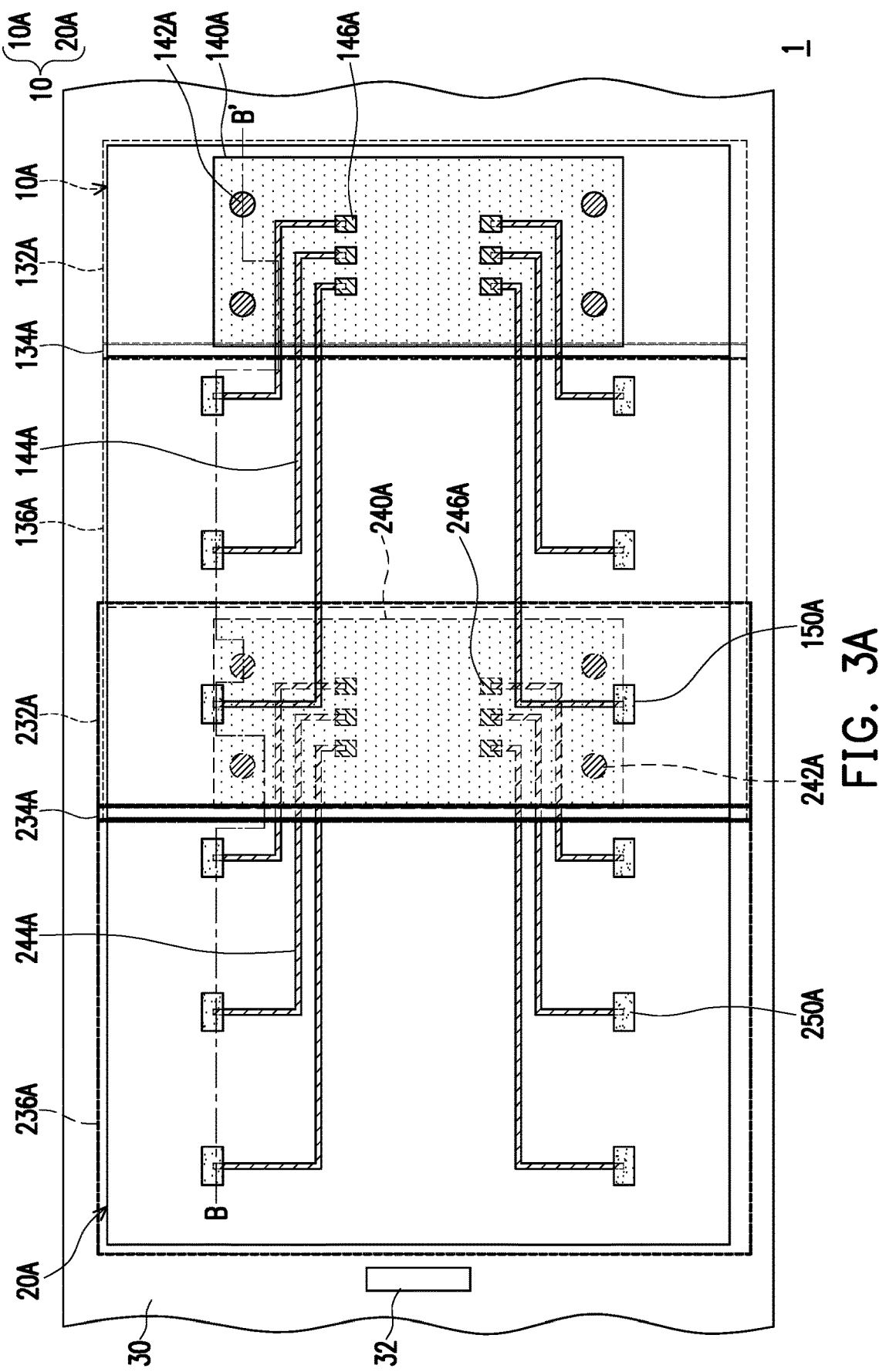
FIG. 3A is a schematic top view of a spliced panel according to an embodiment of the disclosure.
Figure 3B:
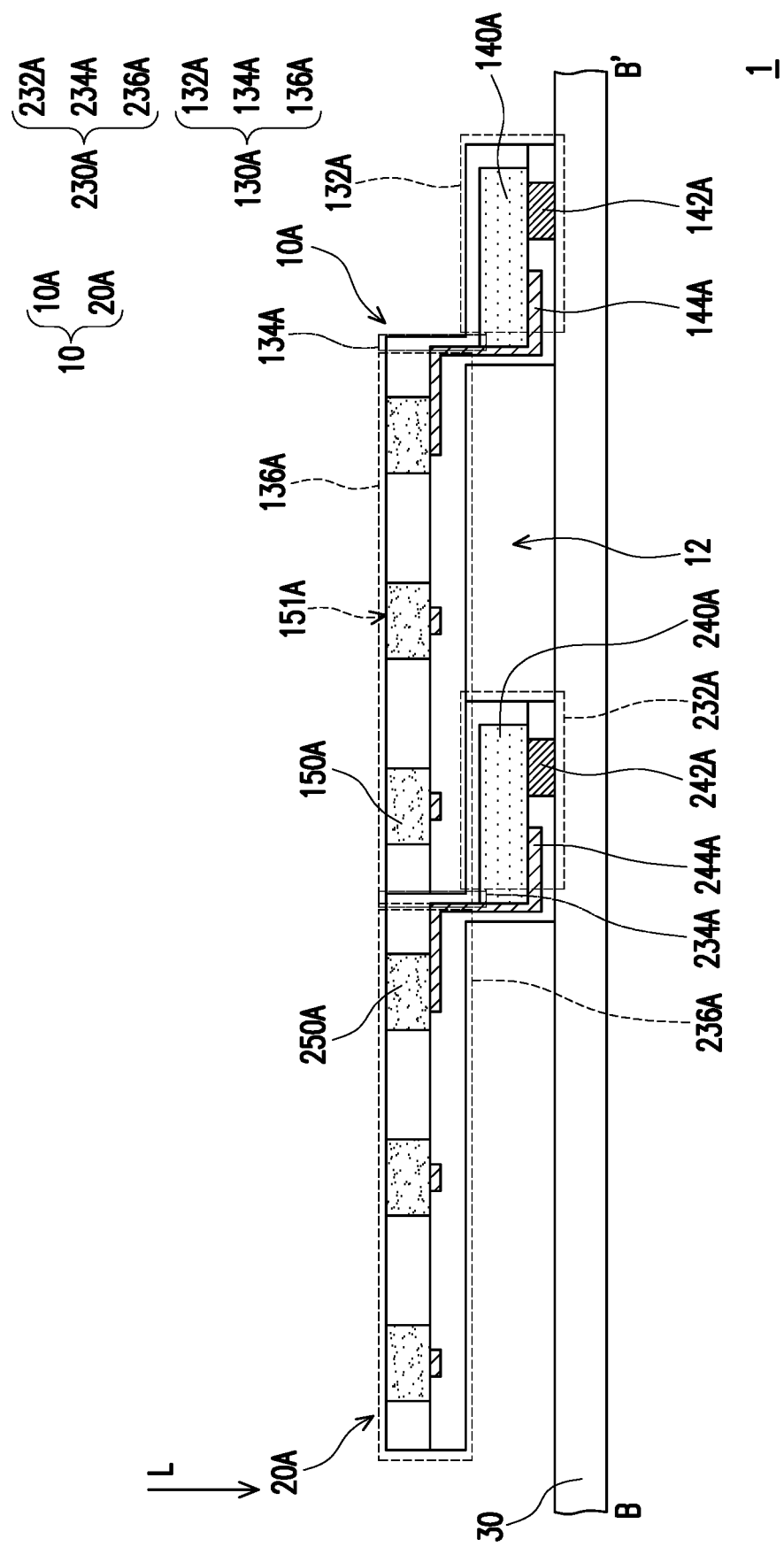
FIG. 3B is a schematic cross-sectional view of a spliced panel taken along a sectional line B-B' depicted in FIG. 3A.

FIG. 3A is a schematic top view of a spliced panel according to an embodiment of the disclosure. For better explanation and observation, FIG. 3 schematically illustrates some of the components and omits other components. FIG. 3B is a schematic cross-sectional view of a spliced panel taken along a sectional line B-B' depicted in FIG. 3A. It should be mentioned that FIG. 3A is a schematic top view of the spliced panel 1. For clear illustration, some elements that are covered in the top view are depicted by solid lines, while the elements located in the overlapping portion of the two spliced units 10A and 20A are depicted by dotted lines.

With reference to FIG. 3A and FIG. 3B, in the present embodiment, the spliced panel 1 includes a plurality of spliced units 10 and a driver circuit board 30. The spliced units 10 are disposed on the driver circuit board 30. The driver circuit board 30 is, for instance, a PCB configured to provide an image signal by providing driver signals, which should however not be construed as a limitation in the disclosure. In some embodiments, the driver circuit board 30 is equipped with a driver device 32 that includes a chip or an IC, which should however not be construed as a limitation in the disclosure. In the present embodiment, the adjacent spliced units 10 may be adjoined to form the spliced panel 1.

In the present embodiment, the spliced units 10 include at least one first spliced unit 10A and at least one second spliced unit 20A. In the present embodiment, the spliced panel 1 includes two adjacent first and second spliced units 10A and 20A for performing the splicing operation, which is taken as an example for explanation. However, the disclosure is not limited thereto. In some embodiments, the spliced panel 1 may further include more first and second spliced units 10A, 20A for performing the splicing operation.

Each of the spliced units 10A and 20A includes substrates 130A and 230A. The substrates 130A and 230A include first parts 132A and 232A and second parts 136A and 236A. As shown in FIG. 1J, the first part 132 has the first bottom surface 131, and the second part 136 has the second bottom surface 135. The height difference D1 exists between the first bottom surface 131 and the second bottom surface 135. In the present embodiment, the first parts 132A and 232A are in contact with the driver circuit board 30, and the light-exiting surfaces 151A of the light-emitting units 150 are arranged in a direction away from the driver circuit board 30. Thereby, the light-exiting surfaces 151A can face users (not shown). With said configurations, the cross-section of the spliced units 10A and 20A has a step-like shape; therefore, the circuit units 140A and 240A and the light-emitting units 150A and 250A can be respectively disposed on the first parts 132A and 232A and the second part 136A and 236A on different horizontal planes. In the present embodiment, each of the first parts 132A and 232A of the spliced units 10A and 20A is located between the second parts 136A and 236A and the driver circuit board 30.

In addition, the spliced units 10A and 20A further include the circuit units 140A and 240A disposed at the first parts 132A and 232A, a plurality of light-emitting units 150A and 250A disposed at the second parts 136A and 236A, the connection parts 134A and 234A respectively connecting the first parts 132A and 232A to the second parts 136A and 236A, and a plurality of signal lines 144A and 244A electrically connecting the circuit units 140A and 240A to the light-emitting units 150A and 250A.

In the present embodiment, the circuit units 140A and 240A further include a plurality of internal bonding pads 146A and 246A and a plurality of external bonding pads 142A and 242A. The internal bonding pads 146A and 246A are respectively electrically connected to the signal lines 144A and 244A. The first parts 132A and 232A are in contact with the driver circuit board 30, and the external bonding pads 142A and 242A are electrically connected to contact points on the driver circuit board 30 (not shown). Thereby, the driving signal of the driver circuit board 30 can be transmitted to the circuit units 140A and 240A through the external bonding pads 142A and 242A. The driving signal is then transmitted to the light-emitting units 150A and 250A through the signal lines 144A and 244A.

It is worth noting that an accommodation space 12 exists between the second part 136A of the first spliced unit 10A and the driver circuit board 30, and the first part 132A of the second spliced unit 20A is located in the accommodation space 12. For instance, in the direction of the normal line L perpendicular to the substrates 130A and 230A, some second parts 136A of the first spliced unit 10A and the first parts 232A of the second spliced unit 20A are overlapped. Thereby, the light-emitting units 150A of the second part 136A of the first spliced unit 10A and the circuit unit 240A of the first part 232A of the second spliced unit 20A are overlapped. In addition, the second part 136A of the first spliced unit 10A adjoins the second part 236A of the second spliced unit 20A. With said configurations, the circuit unit 240A not capable of performing a display function can be overlapped with the light-emitting units 150A and located in the accommodation space 12 between the second part 136A and the driver circuit board 30. Hence, the circuit unit 240A does not occupy any display space. Thereby, on the same horizontal plane, none of the circuit units 140A and 240A are sandwiched between the light-emitting units 150A of the first spliced unit 10A and the light-emitting units 250A of the second spliced unit 20A. As such, the distance between the light-emitting units 150A and 250A of the adjacent spliced units 10A and 20A can be reduced, and so can the display area occupied by the circuit units 140A and 240A be reduced; thereby, the overall density of the light-emitting units 150A and 250A on the spliced panel 1 can be increased, so as to further improve the resolution and the display quality of the spliced panel 1.

In brief, the cross-section of the spliced units 10A and 20A has a step-like shape; therefore, the circuit units 140A and 240A and the light-emitting units 150A and 250A can be respectively disposed on different horizontal planes. Hence, during the splicing operation, the light-emitting units 150A of the adjacent first spliced units 10A and the circuit unit 240A of the second spliced unit 20A can be overlapped. As such, the circuit unit 240A not capable of performing a display function can be located in the accommodation space 12 between the second part 136A and the driver circuit board 30 without occupying any display space. With said configurations, the second part 136A of the first spliced unit 10A can adjoin the second part 236A of the second spliced unit 20A, and the overall density of the light-emitting units 150A and 250A on the spliced panel 1 can be increased, so as to improve the resolution and display quality of the spliced panel 1.

Figure 4:
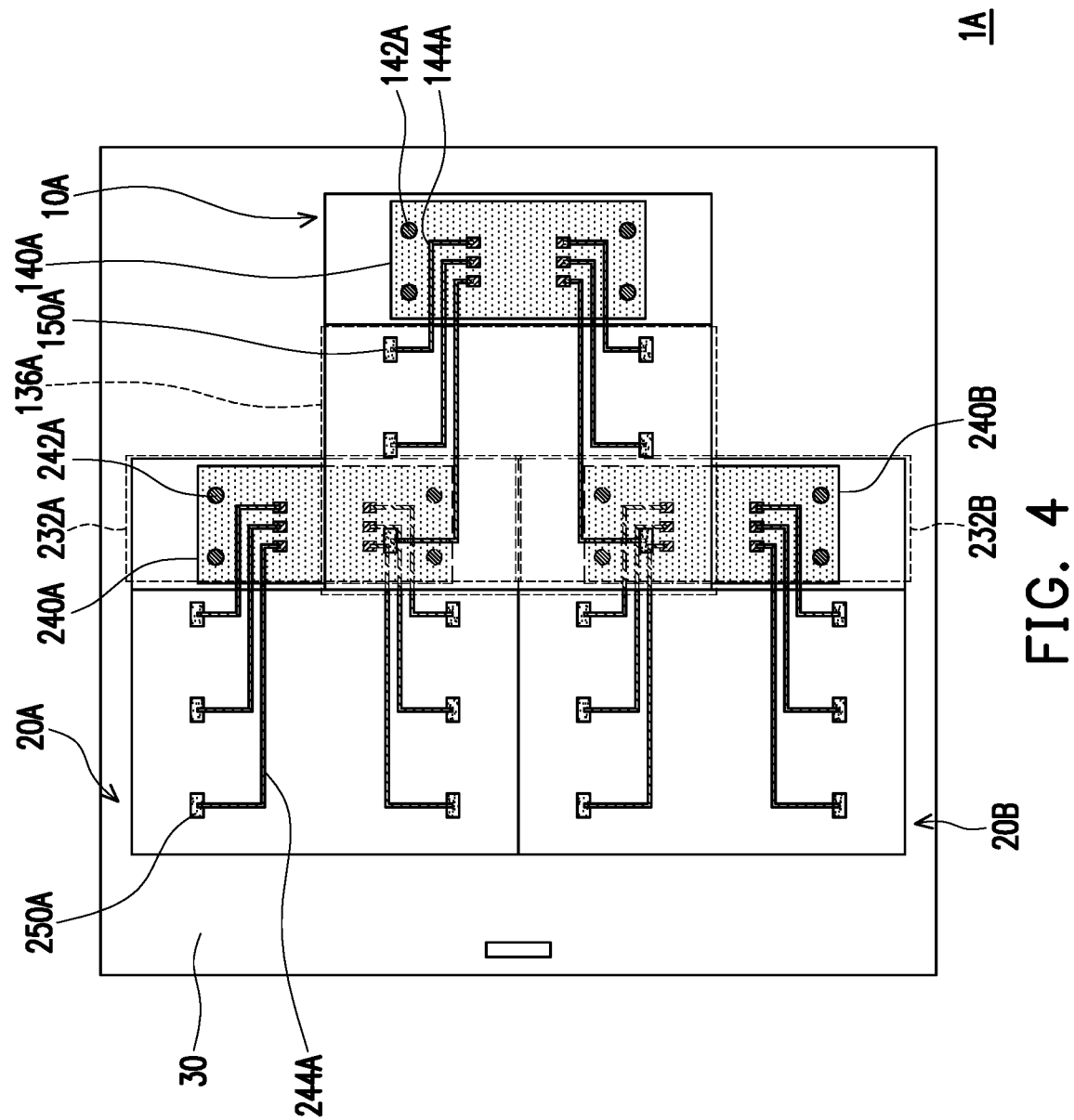
FIG. 4 is a schematic top view of a spliced panel according to another embodiment of the disclosure.

FIG. 4 is a schematic top view of a spliced panel according to another embodiment of the disclosure. For better explanation and observation, FIG. 4 schematically illustrates some of the components, while omitting other components. It should be mentioned that FIG. 4 is a schematic top view of the spliced panel 1A. For clear illustration, some elements that are covered in the top view are depicted by solid lines, while the elements located in the overlapping portion of the spliced units 10A, 20A, and 20B are depicted by dotted lines. With reference to FIG. 4 and FIG. 3A, the spliced panel 1A provided in the present embodiment is similar to the spliced panel 1 depicted in FIG. 3A, while the main difference therebetween lies in that the number of the second spliced units 20A and 20B is plural. As shown in FIG. 4, the second part 136A of the first spliced unit 10A disposed on the driver circuit board 30 is overlapped with a portion of the first part 232A of the second spliced unit 20A close to an upper side of the driver circuit board 30 and a portion of the first part 232B of the second spliced unit 20B close to a lower side of the driver circuit board 30. In other words, the light-emitting units 150A of the second part 136A and portions of the circuit units 240A and 240B on the first parts 232A and 232B are overlapped. Hence, portions of the first parts 232A and 232B of the second spliced units 20A and 20B can be located in the corresponding accommodation space 12 (shown in FIG. 3B). With said configurations, the locations where the spliced units 10A, 20A, and 20B are overlapped or the number of the second spliced units 20A and 20B corresponding to each first spliced unit 10A can be adjusted according to users' requirements. Hence, the method of splicing the spliced units can be more flexible, the quality of the spliced panel 1A can be improved, and technical effects achieved herein are similar to those accomplished according to the previous embodiments.

To sum up, in the spliced unit and the spliced panel provided in one or more embodiments of the disclosure, the cross-section of the spliced unit has a step-like shape; hence, the circuit unit and the light-emitting units can be disposed at different horizontal planes, and the circuit unit and the light-emitting units on the same spliced unit are not overlapped. Hence, during the splicing operation, the light-emitting units of adjacent first spliced units in the spliced panel and the circuit unit of the second spliced unit can be overlapped. As such, the circuit unit not capable of performing a display function can be located in the accommodation space between the second part and the driver circuit board without occupying any display space. With said configurations, the second part of the first spliced unit can adjoin the second part of the second spliced unit. Thereby, the overall density of the light-emitting units on the spliced panel can be increased, so as to further improve the resolution and the display quality of the spliced panel. In addition, the sidewall of the connection part connecting the first part to the second part and the sidewall of the circuit unit are aligned with each other. As such, the probability of breaking the signal lines can be reduced, and the overall electrical reliability can be improved. Moreover, the spliced unit further includes the protection layer, the first thickness of the protection layer on the first part allows the external bonding pads to be exposed and electrically connected to the driver circuit board, and the second thickness of the protection layer on the second part not only can protect the light-emitting units but also can support the second part and the light-emitting units. As such, the structural strength and reliability of the spliced unit and the spliced panel can be improved.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A spliced unit comprising:
    a substrate comprising:
        a first part having a first bottom surface and a first top surface opposite to the first bottom surface; and
        a second part having a second bottom surface and a second top surface opposite to the second bottom surface, wherein a height difference exists between the first bottom surface of the first part and the second bottom surface of the second part;
    a circuit unit disposed at the first top surface;
    a plurality of light-emitting units disposed at the second part of the substrate; and
    a connection part connecting the first part to the second part,
    wherein in a direction of a normal line perpendicular to the substrate, the first part of the substrate and the second part of the substrate are not overlapped, and the circuit unit and the light-emitting units are not overlapped, and
    wherein a sidewall of the circuit unit is aligned with a sidewall of the connection part.

2. The spliced unit as recited in claim 1, further comprising a plurality of signal lines disposed on the substrate, the signal lines respectively extending along the sidewall of the connection part from the circuit unit and electrically connecting the circuit unit to the light-emitting units.

3. The spliced unit as recited in claim 1, further comprising:
    a protection layer disposed on the first part of the substrate, the connection part, and the second part and covering a portion of the circuit unit and the light-emitting units,
    wherein the protection layer has a first thickness T1 on the first part and has a second thickness T2 on the second part, and T2 is greater than T1.

4. A spliced panel comprising:
    a plurality of spliced units, each of the spliced units comprising:
        a substrate comprising a first part having a first bottom surface and a second part having a second bottom surface, a height difference existing between the first bottom surface of the first part and the second bottom surface of the second part; and
    a driver circuit board, the spliced units being disposed on the driver circuit board, and the first part being located between the second part and the driver circuit board,
    wherein the spliced units comprise at least one first spliced unit and at least one second spliced unit,
    wherein an accommodation space exists between the second part of the at least one first spliced unit and the driver circuit board, and the first part of the at least one second spliced unit is located in the accommodation space.

5. The spliced panel as recited in claim 4, wherein in a direction of a normal line perpendicular to the substrate, the second part of the at least one first spliced unit and the first part of the at least one second spliced unit are overlapped, and the second part of the at least one first spliced unit adjoins the second part of the at least one second spliced unit.

6. The spliced panel as recited in claim 4, each of the spliced units further comprising:
    a circuit unit disposed at the first part; and
    a plurality of light-emitting units disposed at the second part;
    a connection part connecting the first part to the second part; and
    a plurality of signal lines disposed on the substrate and electrically connecting the circuit unit to the light-emitting units.

7. The spliced panel as recited in claim 6, wherein the circuit unit comprises a plurality of internal bonding pads electrically connected to the signal lines and a plurality of external bonding pads electrically connected to the driver circuit board.

8. The spliced panel as recited in claim 6, wherein in a direction of a normal line perpendicular to the substrate, the light-emitting units of the second part of the at least one first spliced unit and the circuit unit of the first part of the at least one second spliced unit are overlapped.

9. The spliced panel as recited in claim 4, wherein the number of the at least one second spliced unit is plural, and in a direction of a normal line perpendicular to the substrate, the second part of the at least one first spliced unit and the first parts of the second spliced units are partially overlapped.

10. A spliced unit comprising:
a substrate comprising:
- a first part having a first bottom surface and a first top surface opposite to the first bottom surface; and
- a second part having a second bottom surface and a second top surface opposite to the second bottom surface, wherein a first height difference exists between the first bottom surface of the first part and the second bottom surface of the second part;

a circuit unit disposed at the first top surface;

a plurality of light-emitting units disposed at the second part of the substrate; and a connection part connecting the first part to the second part, wherein a second height difference exists between the first top surface and the second top surface, wherein in a direction of a normal line perpendicular to the substrate, the first part of the substrate and the second part of the substrate are not overlapped, and the circuit unit and the light-emitting units are not overlapped.

* * * * *